United States Patent [19]

D'Asaro et al.

[11] Patent Number: 5,918,794
[45] Date of Patent: Jul. 6, 1999

[54] SOLDER BONDING OF DENSE ARRAYS OF MICROMINIATURE CONTACT PADS

[75] Inventors: Lucian Arthur D'Asaro, Madison;
Keith Wayne Goossen, Aberdeen;
Sanghee Park Hui, New Providence;
Betty Jyue Tseng, Berkeley Heights;
James Albert Walker, Howell, all of N.J.

[73] Assignee: Lucent Technologies Inc., Murray Hill, N.J.

[21] Appl. No.: 08/581,299

[22] Filed: Dec. 28, 1995

[51] Int. Cl.[6] .............................. H05K 3/34; B23K 1/19
[52] U.S. Cl. ................................... 228/180.22; 228/214
[58] Field of Search ............................ 228/180.22, 203, 228/205, 214; 216/67; 156/345; 204/192.32, 192.35

[56] References Cited

U.S. PATENT DOCUMENTS

| | | | |
|---|---|---|---|
| 4,889,960 | 12/1989 | Butt | 174/52.4 |
| 4,917,286 | 4/1990 | Pollacek | 228/118 |
| 4,921,157 | 5/1990 | Dishon et al. | 228/124.1 |
| 4,922,322 | 5/1990 | Mathew | 228/123.1 |
| 5,442,145 | 8/1995 | Imai et al. | 174/267 |
| 5,615,825 | 4/1997 | Bobbio et al. | 228/206 |
| 5,646,068 | 7/1997 | Wilson et al. | 437/183 |
| 5,812,570 | 9/1998 | Spaeth | 372/36 |
| 5,821,154 | 10/1998 | Nashimoto et al. | 438/457 |

OTHER PUBLICATIONS

Metals Handbook Ninth Edition, vol. 6, pp. 1074–1076, 1095, 1096, 1983.
K.W. Goossen et al, "GaAs MQW Modulators Integrated with Silicon CMOS", Apr. 1995, pp. 360–363, *IEEE Photonics Technology Letters*, vol. 7, No. 4.

*Primary Examiner*—Samuel M. Heinrich

[57] ABSTRACT

Each microminiature contact pad included in a dense array of pads on an electronic component contains a relatively thick layer of solder. The layer is treated to form a relatively thin brittle protective layer on the surface of the solder. The structure is then brought into contact with a contact pad in a mating array of pads on another component in a thermocompression bonding step carried out below the melting point of the solder. In that step, the brittle layer is fractured. As a result, solid-state diffusion of conductive material occurs through fissures in the fractured layer, thereby to provide an electrical connection between mating pads on the two components.

11 Claims, 5 Drawing Sheets

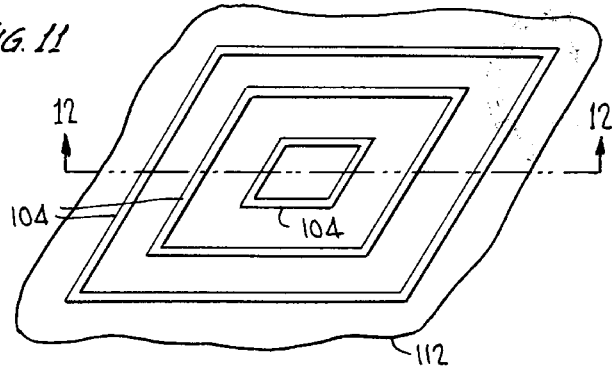
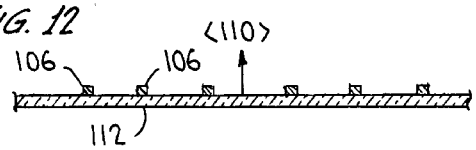
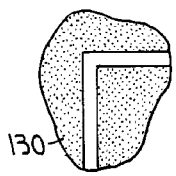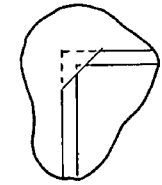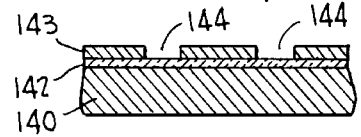
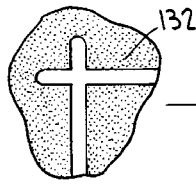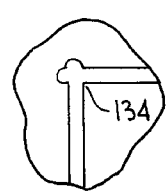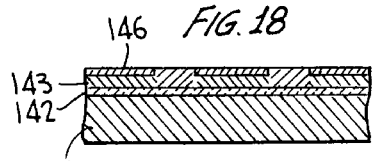
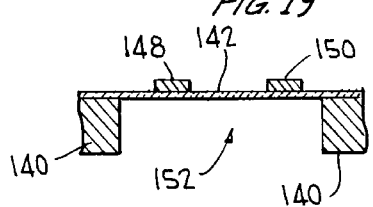

SOLDER BONDING OF DENSE ARRAYS OF MICROMINIATURE CONTACT PADS

BACKGROUND OF THE INVENTION

This invention relates to bonding and, more particularly, to solder bonding of dense arrays of small-area contact pads.

Solder bonding is a commonly used technique for attaching electronic components to each other. Thus, for example, semiconductor chips can be thereby connected to each other in a standard process usually referred to as flip-chip bonding. Or chips can thereby be connected to a circuit board. In either case, solder bonding is effective to establish electrical contact and mechanical connections between aligned solder-containing contact pads on the respective components to be interconnected.

Conventional solder-bonding processes involve melting and remelting of solder layers or bumps in a liquid or gaseous flux. To limit lateral movement of molten solder during such bonding processes, and thereby to decrease the likelihood of shorts occurring between pads, it is often necessary to form a so-called dam around each solder area. This of course complicates the structure and increases the cost of fabricating components having solder-containing contact pads.

Solder bonding of dense arrays of microminiature contact pads is especially difficult. In typical such arrays, the pads are positioned extremely close together and each pad includes multiple very thin layers. Maintaining the geometry and cleanliness of such pad arrays during melting and remelting of solder is particularly challenging. Further, molten solder may interact with constituents in other layers of the pads to deleteriously change the electrical and/or mechanical properties of the pad structures. Also, when interconnecting components formed on substrates having different coefficients of thermal expansion, raising the temperature of the components during solder melting and remelting may introduce sufficiently harmful stresses to break some or all of the interconnections.

Accordingly, efforts have continued by workers skilled in the art directed at trying to devise effective solder-bonding techniques particularly suited for connecting together dense arrays of microminiature contact pads. It was recognized that such efforts, if successful, could improve the yield and thereby lower the cost of making interconnections between electronic components that contain small-area multi-layer solder-containing contact pads.

SUMMARY OF THE INVENTION

In accordance with the principles of the present invention, contact pads included in a first array of pads each contain a relatively thick layer of solder. The solder layer in each pad is treated to form a brittle protective surface layer. In one embodiment, the solder is coated with a relatively thin layer of gold, whereby a brittle protective gold/solder surface layer is almost immediately formed. In another embodiment, a naturally occurring oxide layer on the surface of the solder is processed in a fluorine-containing plasma to form a brittle protective layer comprising an oxyfluoride.

In accordance with the invention, the aforementioned first array of pads is then brought into contact with mating pads in a second array. This is done in a thermo-compression bonding step which is carried out below the melting point of the solder. In one embodiment, each pad in the second array is solderless and comprises a relatively thick surface layer of gold. In that case, the brittle surface layer on each pad of the first array is fractured during the bonding step. As a result, solid-state diffusion of gold and solder occur through fissures in the fractured brittle layer, thereby to establish electrical contact between the mating pads.

In another embodiment, each pad in the second array, as well each pad in the first array, comprises a brittle protective layer formed on the surface of a relatively thick layer of solder. In that case, both brittle layers of each mating pair of contact pads are fractured during the bonding step. Solid-state diffusion of solder then occurs through fissures in the fractured brittle layers to establish electrical contact between mating solder-containing pads.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

For purposes of a specific example, the present invention will be described hereinbelow in terms of a particular illustrative solder bonding application. In that application, an optoelectronic integrated-circuit (IC) chip comprising a substrate made of a III–V compound semiconductor material such as gallium arsenide (GaAs) contains a large array of optical modulators that are to be connected by flip-chip solder bonding to an IC chip comprising a silicon (Si) substrate that contains, for example, complementary metal-oxide-semiconductor (CMOS) circuitry thereon. A practical method of integrating GaAs modulators onto Si circuits via flip-chip solder bonding, but without any suggestion of the inventive contact pad structures described in detail later below, is described in "GaAs MQW Modulators Integrated With Silicon CMOS" by K. W. Goossen et al, *IEEE Photonics Technology Letters,* Vol 7, No. 4, April 1995, pages 360–362.

Figure 1:
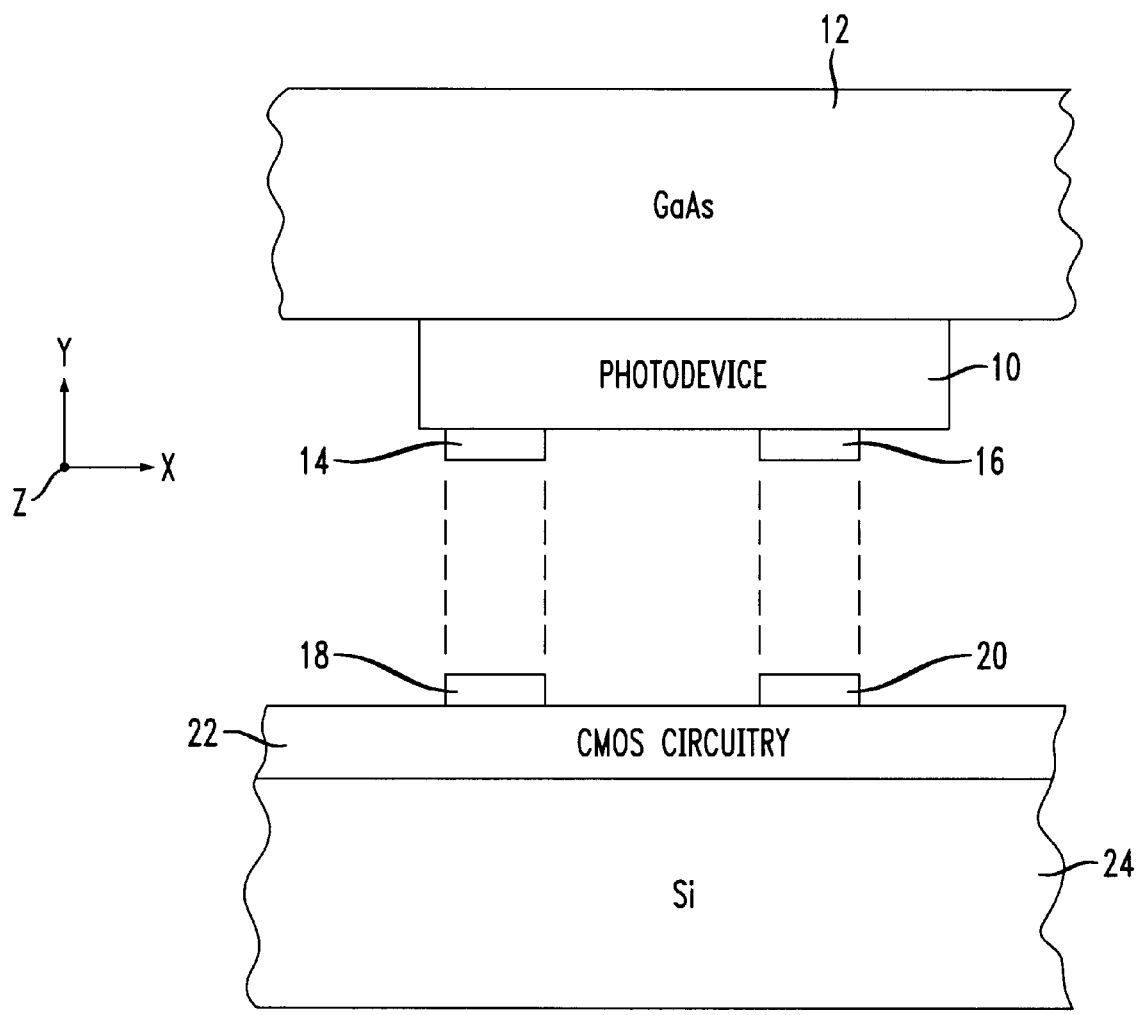
FIG. 1 is a simplified schematic depiction of two illustrative types of integrated-circuit semiconductor chips that are to be interconnected by flip-chip solder bonding.

FIG. 1 herein illustrates the manner in which the aforementioned integration of modulators and Si circuitry as described in the Goossen et al article is carried out. As shown in FIG. 1, a photodevice 10, for example an optical modulator, formed on a GaAs substrate 12 is depicted as having two contact pads 14 and 16 by means of which an electrical signal can be applied to the device 10.

The contact pads 14 and 16 of FIG. 1 are designed to be aligned with mating contact pads 18 and 20. In turn, the pads 18 and 20 are electrically connected to CMOS circuitry 22 formed on a Si substrate 24. In that way, when the mating pads are brought together and bonded, electrical signals from the circuitry 22 can be applied to the photodevice 10 to modulate optical signals that are directed at the device 10. (Alternatively, if the photodevice 10 comprises a photodetector, an electrical signal produced in the device 10 in response to an incident optical signal can be applied to the circuitry 22.)

For purposes of a specific illustrative example, assume that each of the substrates 12 and 24 shown in FIG. 1 is roughly square in shape and measures about seven millimeters (mm) in each of the indicated X and Z directions. Further, assume that approximately 8000 pads connected to photodevices on the substrate 12, each pad measuring about fifteen micrometers ($\mu$m) by fifteen $\mu$m in each of the X and Z directions, are to be interconnected with 8000 mating pads on CMOS circuitry on the substrate 24. For the various reasons given earlier above, conventional solder bonding of such a dense array of small-area pads, involving melting and remelting of solder, is extremely difficult and costly, if not impossible. On the other hand, techniques carried out in accordance with the principles of the present invention are particularly well suited to achieving high-yield solder bonding of such dense arrays of microminiature contact pads.

In accordance with one embodiment of the present invention, multi-layered solder-containing contact pads are formed and subsequently connected together in a thermocompression bonding step without melting the solder. The solder can comprise any appropriate known soldering material such as tin (Sn), lead/tin (Pb/Sn), indium (In), Pb/Sn-based alloys, In/Pb/Sn alloys, In/Pb alloys, In/Sn alloys and other conductive materials that are soft relative to gold (Au). Herein, for purposes of a specific illustrative example, substantially pure Sn will be specified as the solder material included in the described contact pad structures.

Figure 2:
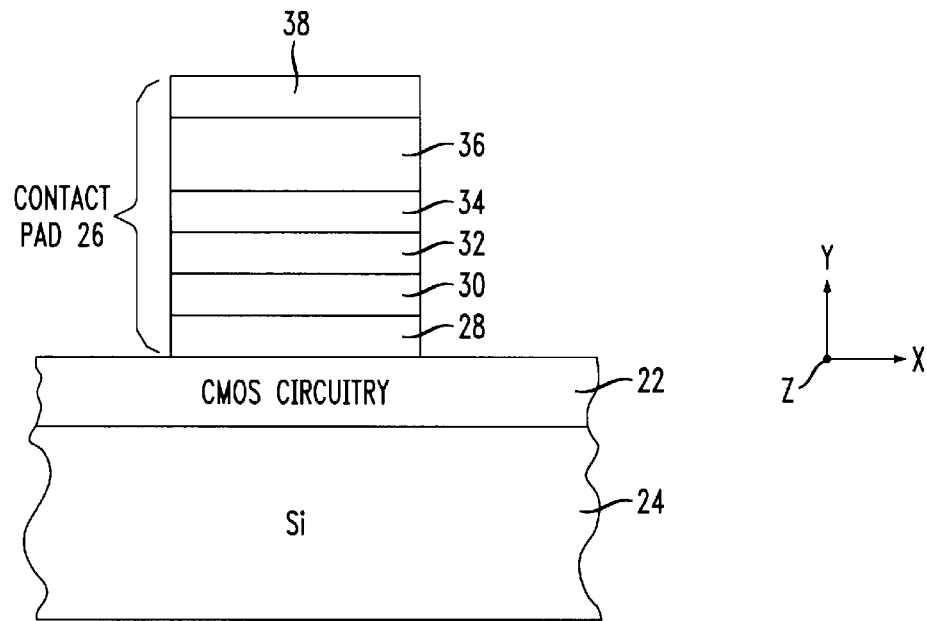
FIG. 2 is a specific illustrative showing of a multi-layered structure made in accordance with the principles of the present invention and suitable for forming contact pads on one of the chips shown in FIG. 1.

One particular illustrative multi-layered contact pad structure 26 made in accordance with the principles of the present invention and suitable for use with CMOS Si-based IC circuitry is depicted in FIG. 2. In particular, FIG. 2 shows the layers of the pad structure 26 immediately after they have been deposited and before any interaction has occurred between the two top layers of the structure 26. This interaction will be described later below in connection with FIG. 4. The indicated X and Z dimensions of the pad structure 26 are each assumed to be about fifteen $\mu$m. The structure 26 corresponds, for example, to one of the contact pads 18 and 20 shown in FIG. 1.

Illustratively, the first or bottom-most layer 28 of the pad structure 26 of FIG. 2 comprises a layer of an alloy such as aluminum(Al)/Si about 0.5 $\mu$m thick in the Y direction. The next layer 30 comprises a titanium (Ti) layer approximately 0.05 $\mu$m thick, which provides a firm bond to the underlying layer 28. A platinum (Pt) layer 32 about 0.1 $\mu$m thick overlies the Ti layer 30 and protects the layer 30 from oxidation. [Alternatively, a layer of nickel (Ni) about 0.1 $\mu$m thick may be employed for the layer 32.] Next, the pad structure 26 comprises a layer 34 of Au about 0.05 $\mu$m thick. Overlying that is a relatively thick layer 36 of solder (for example, Sn) approximately three $\mu$m thick. Finally, the top-most layer 38 of the pad structure 26 comprises a relatively thin layer of Au about 0.1 $\mu$m thick.

Overlying an Al alloy layer such as the layer 28 of FIG. 2 with layers of Ti/Pt/Au is commonly used as a contact metallization in Si-based multi-chip module connection technology. For illustrative purposes, the relatively thick solder layer 36 and the relatively thin Au layer 38 are shown as deposited on such a standard underlying structure. But it should be understood that other conventional electrically conductive materials can be utilized to interconnect the solder layer 36 to underlying devices such as those included in the CMOS circuitry 22.

Figure 3:
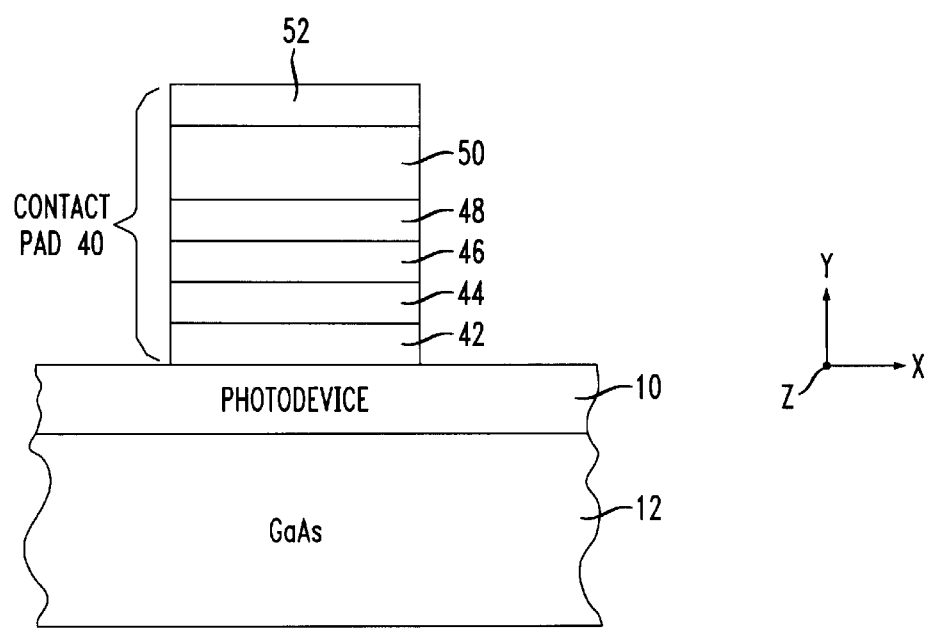
FIG. 3 is a specific illustrative showing of a multi-layered structure made in accordance with the invention and suitable for forming contact pads on the other one of the chips shown in FIG. 1.

Further, a particular illustrative multi-layered contact pad structure 40 made in accordance with the principles of the present invention and suitable for use with GaAs-based IC photodevices is depicted in FIG. 3. In particular, FIG. 3 shows the layers of the pad structure 40 immediately after they have been deposited and before any interaction has occurred between the two top layers of the structure 40. This interaction also will be described later below in connection with FIG. 4. Further, the indicated X and Z dimensions of the pad structure 40 are also each assumed to be about fifteen $\mu$m. The structure 40 corresponds, for example, to one of the contact pads 14 and 16 shown in FIG. 1.

Illustratively, the first or bottom-most layer 42 of the pad structure 40 of FIG. 3 is made of a standard alloy of Au and germanium (Ge), for n-type III–V compound materials such as GaAs, or of a standard alloy of Au and beryllium (Be), for p-type II–V materials. The layer 42 provides an ohmic contact to the underlying photodevice 10, in a manner well known in the art. The next or bonding layer 44 comprises a Ti layer approximately 0.025 $\mu$m thick. A Pt layer 46 about 0.05 $\mu$m thick overlies the Ti layer 44 and protects the surface of the layer 44 from oxidation. Next, the pad structure 40 comprises a layer 48 of Au about 0.3 $\mu$m thick. Overlying that is a relatively thick layer 50 of solder (for example, Sn) approximately two $\mu$m thick. Finally, the top-most layer 52 comprises a relatively thin layer of Au about 0.1 $\mu$m thick.

A Au/Ge or Au/Be layer such as the layer 42 of FIG. 3, with overlying Ti/Pt/Au layers, is commonly used in the GaAs-based IC art as a standard contact structure. For illustrative purposes, the relatively thick solder layer 50 and the relatively thin Au layer 52 are shown as deposited on such a standard structure. But it should be understood that other conventional electrically conductive materials can be utilized to interconnect the solder layer 50 to underlying devices such as the photodevices 10.

By way of example, the various layers shown in FIGS. 2 and 3 that comprise the contact pad structures 26 and 40 are successively deposited by a known technique such as evaporation, sputtering or electroplating. After deposition of successive blanket layers, the multiple individual pad structures are defined by standard lithographic techniques, in a manner well known in the art.

Almost immediately after the relatively thin Au layers 38 and 52 are respectively deposited on the Sn layers 36 and 50 shown in FIGS. 2 and 3, the Au and underlying Sn react with each other to form a Au/Sn intermetallic compound. After the reaction, the two top layers of each of the pads 26 and 40 appear as represented in FIG. 4.

Figure 4:
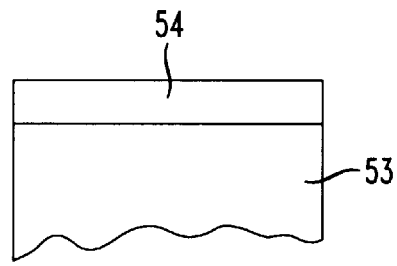
FIG. 4 represents a portion of one of the pads of the type illustrated in either FIG. 2 or FIG. 3 subsequent to deposition of its top-most layer.

The upper layer shown in FIG. 4, designated by reference numeral 54, comprises the aforespecified Au/Sn intermetallic material. Illustratively, the layer 54 is about 0.2 μm thick, and the remaining unreacted portion of the Sn layer (designated by reference numeral 53) is approximately 1.8 μm thick. Significantly, the relatively thin layer 54, which protects the surface of the underlying Sn layer 56 from oxidation, is brittle relative to the underlying relatively thick layer 56.

In accordance with the principles of the present invention, mating contact pad structures such as those designated 14, 18 and 16, 20 shown in FIG. 1, or pads 26 and 40 shown in FIGS. 2 and 3, are brought together under pressure and at an elevated temperature in a thermo-compression bonding step. Importantly, the maximum temperature reached during the bonding operation is selected to be below the melting point of the solder layers included in the pad structures. In the case wherein Sn is used to form the solder layers, the temperature during bonding is thus kept below 232 degrees Celsius (which is the melting point for Sn).

The pressure achieved in the bonding step is designed to be sufficient to fracture the aforespecified top-most brittle layers of each pair of mating contact pad structures. As a consequence, fissures occur in each such fractured layer. In turn, solder diffuses through these fissures and migrates to contact the solder of its mating pad. The elevated temperature established during the bonding operation is selected to facilitate and enhance solid-state diffusion of solder through these fissures. As a result, effective solder-to-solder electrical connections are thereby made between each bonded pair of mating contact pads.

By way of example, the aforedescribed thermo-compression bonding operation for a thin Au/Sn layer on Sn is carried out in air at a pressure in the range of about 125-to-250 kilograms per square centimeter and at a temperature in the range of approximately 130-to-190 degrees Celsius. In one such specific illustrative bonding step, a pressure of about 150 kilograms per square centimeters and a temperature of about 170 degrees Celsius were effective to achieve the desired electrical connections. Under these conditions, minimal lateral movement of the contact pad layers occurs during bonding. Accordingly, the liklihood of shorts occurring during bonding between adjacent pads in a dense array of pads is substantially reduced or eliminated. Also, because the solder is not melted during the bonding step, the problem of molten solder deleteriously interacting with other layers in the pad structures is obviated. Further, the flux-less and relatively low-temperature bonding operation is characterized in practice by a high degree of cleanliness and minimal stresses In accordance with another embodiment of the principles of the present invention, each contact pad structure in an array of pads does not include the top-most Au layer shown in each of FIGS. 2 and 3. Instead, a naturally occurring oxide layer is permitted to form on the top surface of the solder layer included in each such structure. Such an alternative arrangement is represented in FIG. 5.

Figure 5:
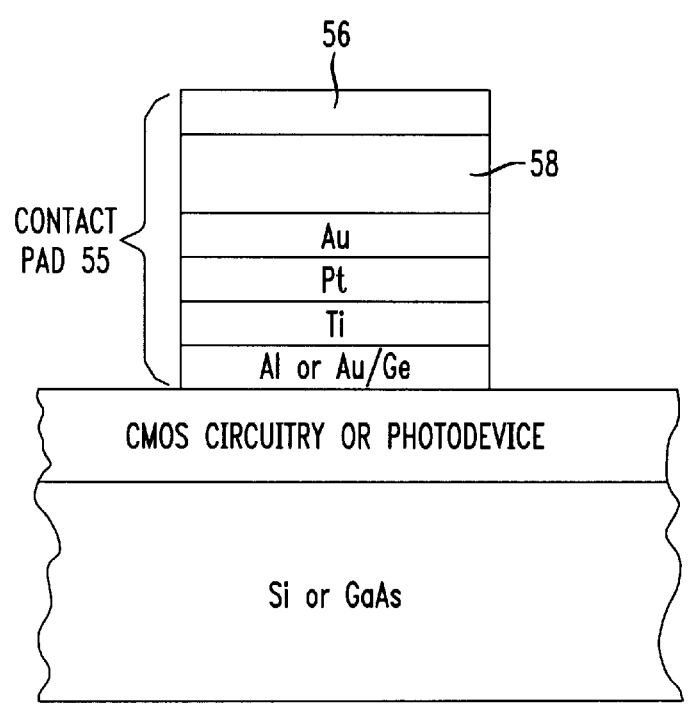
FIG. 5 shows a multi-layered contact pad structure made in accordance with the invention and which may be used in place of either or both of the type of pad represented in FIGS. 2 and 3.

Thus, for example, FIG. 5 shows a contact pad 55 comprising a top-most tin oxide layer 56 about 0.003 μm thick formed on the top surface of a Sn layer 58. Further, additional layers underlie the Sn layer 58 to form a contact pad which is of the type suited for use either with the CMOS circuitry depicted in FIG. 2 or with the photodevices represented in FIG. 3. In other words, FIG. 5 is intended to be a generic representation of an alternative arrangement that may be used in place or either or both of the pad structures 26 and 40 shown in FIGS. 2 and 3.

In further accordance with the invention, the contact pad structure shown in FIG. 5 is processed to convert the tin oxide layer 56 into a layer that is both brittle with respect to and protective of the underlying Sn layer 58. Advantageously, the tin oxide layer 56 is converted to a tin oxyfluoride layer in a plasma treatment process.

A specific illustrative technique for carrying out the aforedescribed conversion of the layer 56 of FIG. 5 is described in U.S. Pat. No. 4,921,157. Thus, for example, the conversion is accomplished by placing the component containing contact pads such as the pad 55 in a reaction chamber and subjecting the top-most layers thereof including the layer 56 to a fluorine-containing plasma. Illustratively, to form the plasma, a gas such as $SF_6$, $CF_4$, $C_2F_6$ or a mixture thereof is introduced into the chamber. The temperature in the chamber is established, for example, in the range of about 34-to-50 degrees Celsius. The pressure in the chamber is selected, for example, to be in the range of aproximately five milliTorr-to-one Torr, and the treatment time is typically relatively short (for example, about one-half-to-three minutes). Power level, gas flow, gas mixture and other typical plasma processing conditions may vary according to the reactor configuration and the particular nature of the contact pad structures to be treated.

Figure 6:
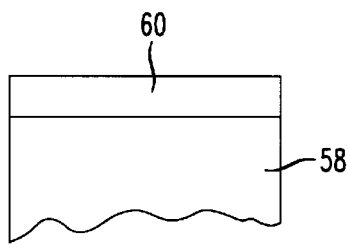
FIG. 6 represents a portion of the FIG. 5 structure after it has been processed to prepare it for solder bonding.

FIG. 6 represents a portion of the contact pad structure 55 of FIG. 5 after the aforespecified plasma treatment has been carried out. As a result of the treatment, the tin oxide layer 56 of FIG. 5 is converted to a tin oxyfluoride layer 60. In one particular illustrative case, the layer 60 is about 0.005 μm thick. And, as mentioned above, the layer 60 is brittle relative to the underlying solder layer 58 and also protective of the surface of the layer 58.

Fracturing of the top-most layers of mating contact pad structures, each of the type represented in FIG. 6, is accomplished in a thermo-compression bonding step, in the particular illustrative manner described above. In that step, solid-state solder-to-solder diffusion occurs through fissures in the fractured tin oxyfluoride layers, thereby to form an effective electrical connection between the solder layers in each pair of mating pad structures.

Figure 7:
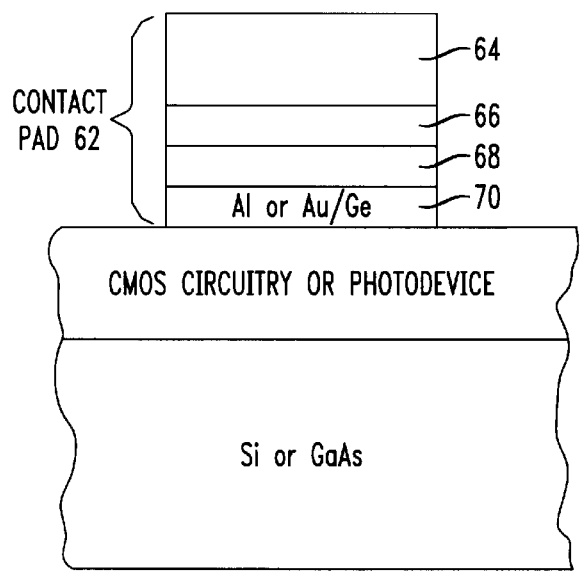
FIG. 7 illustrates a multi-layered solderless contact pad structure made in accordance with the invention and which may be employed in conjunction with a mating one of the multi-layered solder-containing contact pad structures shown in FIGS. 2, 3 or 5 to accomplish solder bonding.

Advantageously, the contact pad structures on either one of the components to be solder bonded together may be of the simpler form represented in FIG. 7. In that case, the mating contact pads on the other component would be of the type of one of the structures shown in FIGS. 2 through 6 and described above.

In the FIG. 7 arrangement, the solder layer and the overlying brittle layer depicted in each of FIGS. 4 and 6 are not present. The layered structure of the contact pad 62 shown in FIG. 7 is intended to represent either the pad 26 shown in FIG. 2, but without the layers 36 and 38, or the pad 40 of FIG. 3, but without the layers 50 and 52, or the pad 55 of FIG. 5, but without the layers 56 and 58.

More specifically, the contact pad 62 of FIG. 7 comprises, for example, a Au layer 64, a Pt layer 66, a Ti layer 68, and an Al alloy(or Au/Ge or Au/Be) layer 70. As noted earlier, such a contact pad structure may be used either on an IC chip comprising Si-based CMOS circuitry or on an IC chip comprising GaAs-based photodevices. Thus, for example, the contact pads 14 and 16 of FIG. 1 could be of the type represented in FIG. 3 or FIG. 5 and the respective mating contact pads 18 and 20 could be of the type represented in FIG. 7. Or the contact pads 14 and 16 could be of the type represented in FIG. 7 and the contact pads 18 and 20 could be of the type represented in FIG. 3 or FIG. 5.

In accordance with the invention, a contact pad such as that shown in FIG. 7 is connected to a mating contact pad whose top two layers are depicted in FIG. 4 or FIG. 6. This is done in a thermo-compression bonding step of the type specified earlier above. In that step, the brittle protective layer (Au/Sn or tin oxyfluoride) on each pad of an array of pads is fractured when the top-most Au layer on its mating pad is brought into contact therewith. As a result, solid-state diffusion of Au and solder occurs through fissures in each fractured brittle layer. The diffused material forms an electrical connection between the pads of each mating pair.

Figure 8:
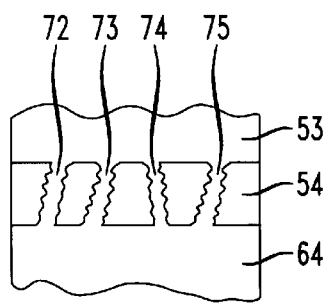
FIG. 8 is a simplified schematic representation of two illustrative contact pads bonded together.

In a simplified schematic way, FIG. 8 represents two specific illustrative contact pads of a component assembly bonded together in accordance with the principles of the present invention. By way of a particular example, a contact pad such as that depicted in FIG. 7 is shown in FIG. 8 bonded to a contact pad such as that illustrated in FIG. 4. More specifically, FIG. 8 shows a pad containing a Au layer 64 such as that shown in FIG. 7 bonded to a pad containing a Au/Sn layer 54 and a Sn layer 53 such as those shown in FIG. 4. In particular, FIG. 8 schematically depicts fissures extending through the layer 54. These fissures, formed in the brittle layer 54 during the aforespecified thermo-compression bonding step, are designated in FIG. 8 by reference numerals 72 through 75. It is hypothesized that the conductive material that forms in the fissures 72 through 75 during bonding comprises intermetallic compounds of Au and Sn and/or solutions of Au in Sn.

In an interconnected assembly of the particular type represented in FIG. 1, the individual photodevices typically have to be isolated from each other after the above-specified solder bonding operation has been carried out. As described in detail in the aforecited Goossen et al article, this may be done, for example, by etching away the GaAs substrate 12. To protect the front faces of the interconnected chips from the substrate etchant, a low-viscosity epoxy can be flowed between the chips and then hardened by baking. After the substrate-removal step, the epoxy can, if desired, be removed in a dry plasma etching step. Or the epoxy can be left in place to impart mechanical strength and rigidity to the final assembly of bonded microminiature components.

Finally, it is to be understood that the above-described arrangements and techniques are only illustrative of the principles of the present invention. In accordance with these principles, numerous modifications and alternatives may be devised by those skilled in the art without departing from the spirit and scope of the invention. Thus, for example, although primary emphasis above has been directed to utilizing Au as the relatively thick layer 64 of FIG. 7, it should be understood that other conductive materials that do not oxidize or do not oxidize easily in air can be substituted therefor. Examples of such other materials are palladium and Pt. Also, other conductive materials that react with solder material to form a protective brittle layer can be substituted for the relatively thin Au layer 38 or the layer 52.

What is claimed is:

1. A method for bonding first and second aligned arrays of contact pad structures to each other, said first and second arrays being respectively disposed on first and second components, each of said structures including a relatively thick conductive layer, the conductive layers in at least said first array comprising solder layers, said method comprising the steps of forming a relatively thin brittle protective layer on the surface of each solder layer, and bonding said aligned arrays at a temperature below the melting point of said solder and at a pressure to fracture said brittle layers and to cause fissures in said fractured brittle layers and solid-state diffusion of solder through said fissures, thereby bonding said first and second components to each other.

2. A method for bonding together first and second components which respectively include thereon mating dense arrays of microminiature contact pad structures each containing conductive material, said method comprising the steps of forming each contact pad structure on at least one of said components to include a relatively thick layer of solder and a relatively thin brittle protective layer on the surface of said solder layer, and then bringing the mating arrays of pad structures together in a thermo-compression bonding step at a temperature below the melting point of said solder and at a pressure sufficient to fracture said brittle layers and form fissures therethrough, whereby solid-state diffusion of conductive material including solder occurs through said fissures to effect an electrical connection between each pair of mating pad structures on said first and second components.

3. A method as in claim 2 wherein said solder layer comprises a material selected from the group consisting of tin, lead/tin, indium, lead/tin alloys, indium/lead/tin alloys, indium/lead alloys and indium/tin alloys.

4. A method as in claim 3 wherein said brittle protective layer is formed by depositing a relatively thin layer of gold on the surface of said solder, thereby to form a surface layer comprising a gold/solder intermetallic compound.

5. A method as in claim 4 wherein the contact pad structures on both components are formed by depositing a relatively thin layer of gold on a relatively thick layer of solder.

6. A method as in claim 4 wherein the contact pad structures on the other one of said components each include a relatively thick surface layer of gold.

7. A method as in claim 3 wherein said brittle protective layer is formed by allowing a relatively thin oxide layer to form on the surface of said solder and then subjecting said oxide layer to a fluorine-containing plasma to convert the oxide to a solder/oxyfluoride compound.

8. A method as in claim 7 wherein each of the contact pad structures on both components includes a relatively thick solder layer on which a relatively thin oxide layer is permitted to form and then converted to a solder/oxyfluoride compound by subjecting the oxide layer to a fluorine-containing plasma.

9. A method as in claim 7 wherein the contact pad structures on the other one of said components each include a relatively thick surface layer of gold.

10. A method as in claim 3 wherein said solder comprises tin and said thermo-compression bonding step is carried out in air at a temperature in the range of about 130-to-190 degrees Celsius.

11. A method as in claim 10 wherein said thermo-compression bonding step is carried out at a pressure in the range of approximately 125-to-250 kilograms per square centimeter.

* * * * *